United States Patent
Ohashi

(12) 
(10) Patent No.: US 6,480,077 B2
(45) Date of Patent: Nov. 12, 2002

(54) SURFACE ACOUSTIC WAVE FILTER DEVICE HAVING A SIGNAL LINE CONNECTED BY A WIRE TO A FLOATING ELECTRODE

(75) Inventor: Wataru Ohashi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/805,898

(22) Filed: Mar. 15, 2001

(65) Prior Publication Data

US 2001/0022545 A1 Sep. 20, 2001

(30) Foreign Application Priority Data

Mar. 17, 2000 (JP) ........................................ 2000-076584

(51) Int. Cl.[7] ................................................. H03H 9/64
(52) U.S. Cl. .................... 333/193; 310/313 R; 333/133
(58) Field of Search ................................. 333/193–196, 333/133

(56) References Cited

U.S. PATENT DOCUMENTS 5,999,069 A * 12/1999 Ushiroku ..................... 333/193

FOREIGN PATENT DOCUMENTS

| JP | 2-224388 | * | 9/1990 |
| JP | 06334468 A | | 2/1994 |
| JP | 10-256869 | * | 9/1998 |

* cited by examiner

Primary Examiner—Robert Pascal
Assistant Examiner—Barbara Summons
(74) Attorney, Agent, or Firm—Volentine Francos, PLLC

(57) ABSTRACT

A surface acoustic wave device includes a piezoelectric substrate, a first plurality of resonators which are connected in series and formed on the piezoelectric substrate, a second plurality of resonators which are connected in parallel and formed on the piezoelectric substrate, an input signal line receiving input signals, a floating electrode being in a floating state and a wire connecting a point on the input signal line to the floating electrode.

14 Claims, 18 Drawing Sheets

12: SAW filter

Frequency [MHz]

SAW filter without open stub (Sample 1)

SAW filter with open stub
(Sample 2)

SAW filter without open stub
(Sample 3)

SAW filter with open stub the length of stub L1 (L1<L2)
(Sample 4)

SAW filter with open stub the length of stub L2 (L1<L2)
(sample 5)

SAW filter with open stub (output side)

SURFACE ACOUSTIC WAVE FILTER DEVICE HAVING A SIGNAL LINE CONNECTED BY A WIRE TO A FLOATING ELECTRODE

The present application claims priority under 35 U.S.C. § 119 to Japanese Application No. 076584/2000 filed on Mar. 17, 2000, which is hereby incorporated by reference in its entirety for all purposes.

BACKGROUND OF THE INVENTION

1. Field of the Invention

The present invention relates to a surface acoustic wave filter device utilizing surface acoustic waves.

2. Description of the Related Art

With the recent rapid spread of automobile telephones and portable telephones, the necessity for small-sized and high-performance high-frequency Surface Acoustic Wave (SAW) filters has increased.

FIG. 18 shows a conventional SAW filter device 1. The SAW filter device 1 has a SAW filter 2 and a multi-layer ceramic package. The SAW filter 2 has a series arm 3, a first parallel arm 4 and a second parallel arm 5. The first series arm 3 is disposed between a filter input terminal TFi and a filter output terminal TFo, and the first parallel arm 4 and the second parallel arm 5 are disposed between the series arm 3 and a reference potential.

The series arm 3 has a first series resonator S1, a second series resonator S2, and a third series resonator S3. These resonators are disposed in series between the filter input terminal TFi and the filter output terminal TFo. One terminal of the first series resonator S1 is connected to the filter input terminal TFi, and another terminal of the first series resonator S2 is connected to a node n1. One terminal of the second series resonator S2 is connected to the node n1, and another terminal of the second series resonator S2 is connected to a node n2. One terminal of the third series resonator S3 is connected to the node n2, and another terminal of the third series resonator S3 is connected to the filter output terminal TFo.

The first parallel arm 4 has a first parallel resonator P1, and the second parallel arm 5 has a second parallel resonator P2. One terminal of the first parallel resonator P1 is connected to the node n1, and another terminal of the first parallel resonator P1 is connected to a parallel arm reference potential terminal TPg. One terminal of the second parallel resonator P2 is connected to the node n2, and another terminal of the second parallel resonator P2 is connected to the parallel arm reference potential terminal TPg.

The filter input terminal TFi is connected to a package input electrode TPCi via a bonding wire Wi. The filter output terminal TFo is connected to a package output electrode TPCo via a bonding wire Wo. The parallel arm reference potential terminal TPg is connected to a package reference potential electrode TPCg1 via a bonding wire Wg1. The SAW filter device 1 is applied to a band pass filter, therefore it is preferable to decrease signals within an attenuating wave band properly.

However, an input/output impedance of the SAW filter varies because of manufacturing error. An impedance of the package also varies because of manufacturing error. The bonding wires and interconnects on a package have parasitic inductances and parasitic capacitors, which also vary an input/output impedance of the SAW filter device 1. Therefore, a sufficient impedance matching between the package and the SAW filter 2 is not provided in order to achieve a proper characteristic as a SAW filter device.

SUMMARY OF THE INVENTION

The present invention is therefore directed to a surface acoustic wave device which substantially overcomes one or more of the problems due to the limitations and disadvantages of the related art.

These and other objects are provided by a surface acoustic wave device including a piezoelectric substrate, a first plurality of resonators which are connected in series and formed on said piezoelectric substrate, a second plurality of resonators which are connected in parallel, and formed on said piezoelectric substrate, an input signal line receiving input signals, a floating electrode being in a floating state, and a wire connecting a point of said input signal line to said floating electrode.

DETAILED DESCRIPTION OF THE PREFERRED EMBODIMENTS

Figure 1:
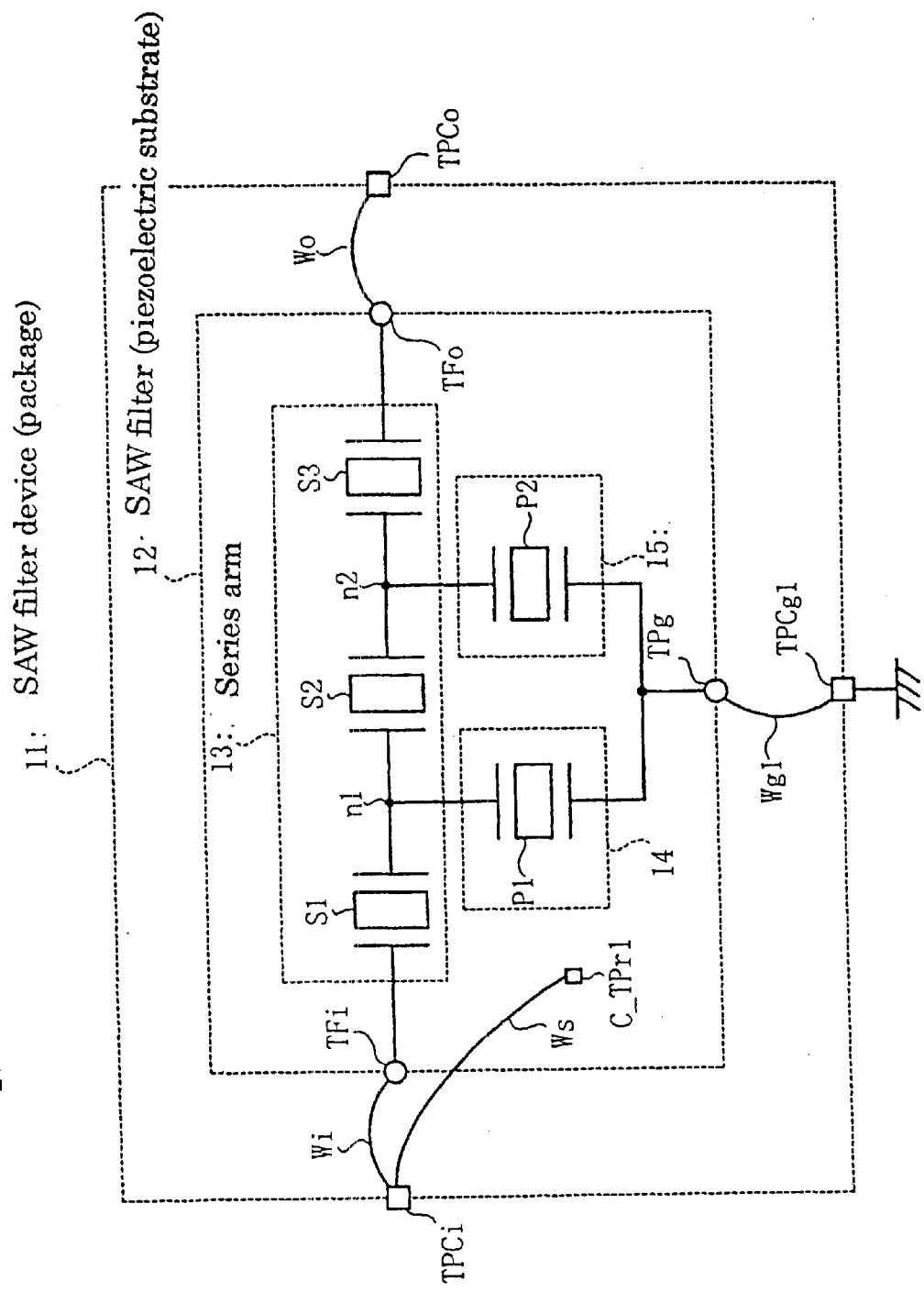
FIG. 1 shows a schematic diagram of a SAW filter device of a first preferred embodiment of the present invention.

The preferred embodiments are described below with respect the accompanying drawings. The same reference numerals are applied to the same elements in each embodiment and drawings.

FIG. 1 is a schematic diagram of a Surface Acoustic Wave (SAW) filter device of a first preferred embodiment. The SAW filter device 11 has a SAW filter 12, which is formed on a piezoelectric substrate, and a multi-layer ceramic package. The SAW filter 12 has a series arm 13, a first parallel arm 14 and a second parallel arm 15. The first parallel arm 13 is disposed between a filter input terminal TFi and a filter output terminal TFo, and the first parallel arm 14 and the second parallel arm 15 are disposed between the series arm 13 and a parallel arm reference potential terminal TPg.

The series arm 13 has a first series resonator S1, a second series resonator S2, and a third series resonator S3. These resonators are disposed in series between the filter input terminal TFi and the filter output terminal TFo. One terminal of the first series resonator S1 is connected to the filter input terminal TFi, and another terminal of the first series resonator S1 is connected to a node n1. One terminal of the second series resonator S2 is connected to the node n1, and another terminal of the second series resonator S2 is connected to a node n2. One terminal of the third series resonator S3 is connected to the node n2, and another terminal of the third series resonator S3 is connected to the filter output terminal TFo.

The first parallel arm 14 has a first parallel resonator P1, and the second parallel arm 15 has a second parallel resonator P2. One terminal of the first parallel resonator P1 is connected to the node n1, and another terminal of the first parallel resonator P1 is connected to a parallel arm reference potential terminal TPg. One terminal of the second parallel resonator P2 is connected to the node n2, and another terminal of the second parallel resonator P2 is connected to the parallel arm reference potential terminal TPg.

The filter input terminal TFi is connected to a package input electrode TPCi via a bonding wire Wi. The filter output terminal TFo is connected to a package output electrode TPCo via a bonding wire Wo. The parallel arm reference potential terminal TPg is connected to a package reference potential electrode TPCg1 via a bonding wire Wg1.

The SAW filter device 11 of the first preferred embodiment further includes a first common electrode CTPr1 and a stub bonding wire Ws. The first common electrode CTPr1 is connected to the package input electrode TPCi via the stub bonding wire Ws. The first common electrode is in a floating state. The function of the first common electrode CTPr1 and the stub bonding wire Ws is described hereinafter.

Figure 2:
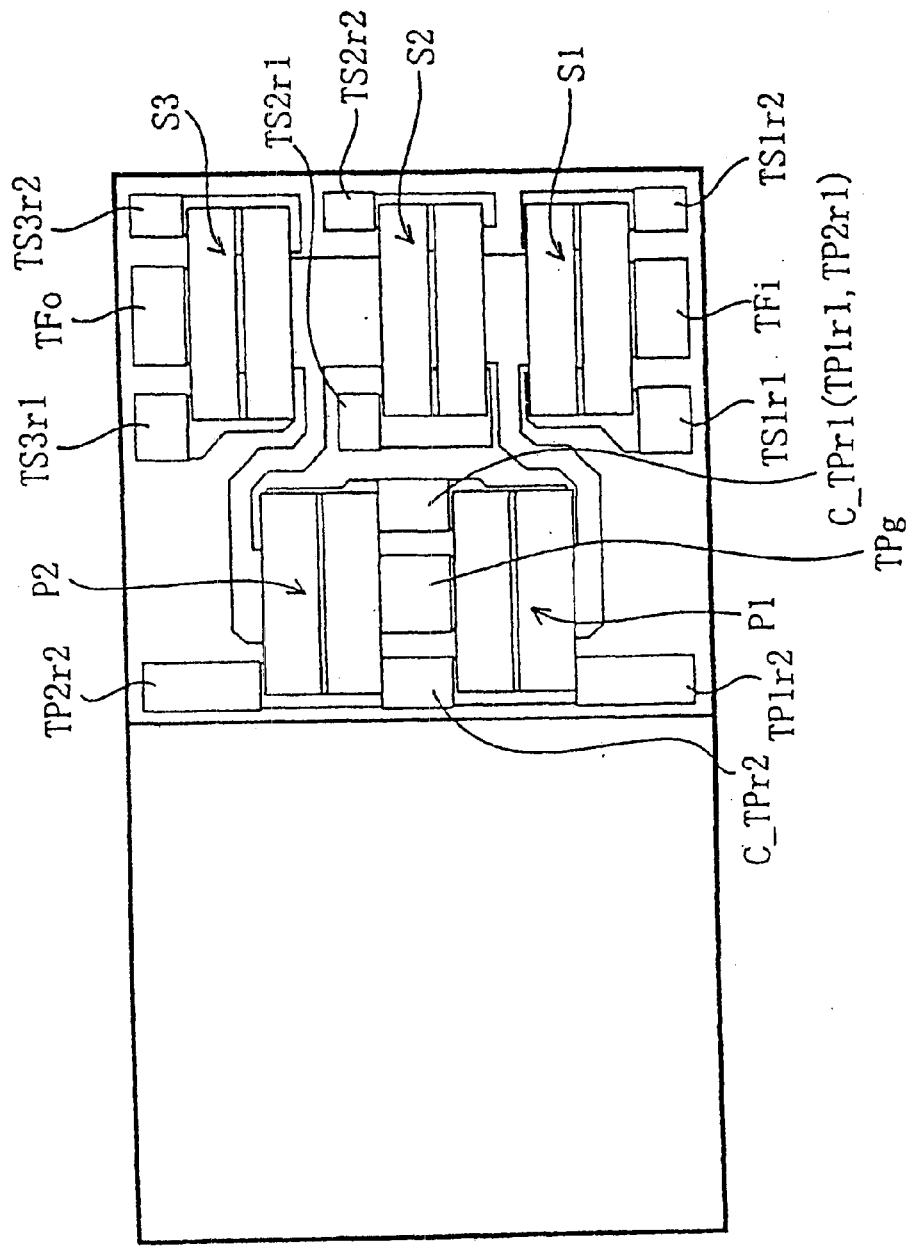
FIG. 2 shows a plane view of a SAW filter of the first preferred embodiment of the present invention.

FIG. 2 is a plane view of the SAW filter 12 of the first preferred embodiment. The other parts except for the series arm 13, and the first and second parallel arms 14, 15 are not shown in FIG. 2. Each of the first series resonator S1, the second series resonator S2, the third series resonator S3, the first parallel resonator P1 and the second parallel resonator P2 has two reflectors in this embodiment.

Each reflector has two reflector electrodes in this embodiment, and the each reflector electrode is formed on the piezoelectric surface in this embodiment. The reflectors of the first series resonator S1 have reflector electrodes TS1r1 and TS1r2. The reflectors of the second series resonator S2 have reflector electrodes TS2r1 and TS2r2. The reflectors of the third series resonator S3 have reflector electrodes TS3r1 and TS3r2. The reflectors of the first parallel resonator P1 have reflector electrodes TP1r1 and TP1 r2. The reflectors of the second parallel resonator P2 have electrodes TP2r1 and TP2r2. (as shown in FIG. 2).

The reflector electrode TP1r1 of the first parallel resonator P1 and the electrode TP2r1 of the second parallel resonator S2 are commonly connected to the first common electrode CTPr1 in this embodiment. The reflector electrode TP1r2 of the first parallel resonator P1 and the reflector electrode TP2r2 of the second parallel resonator P2 are commonly connected to the second common electrode CTPr2 in this embodiment.

As described above, the SAW filter 12 has the filter input terminal TFi, the filter output terminal TFo, and the parallel arm reference potential terminal TPg as shown in FIG. 2.

Figure 3:
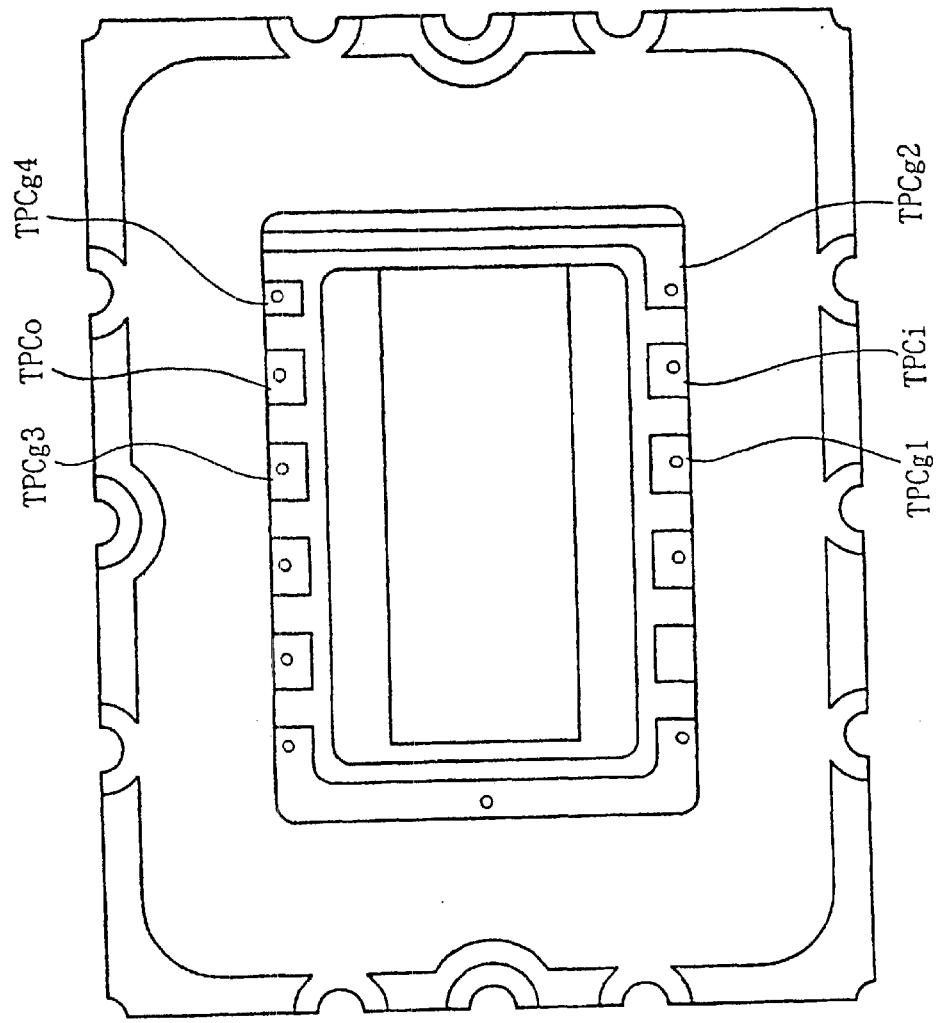
FIG. 3 shows a plane view of a ceramic package of the first preferred embodiment of the present invention.

FIG. 3 is a plane view of the multi-layer ceramic package to hold the SAW filter 12. The package. has five layers in this preferred embodiment. A third layer 21 is shown in FIG. 3. The SAW filter 12 is fixed at a central portion of the third package layer. A plurality of electrodes are formed at a peripheral portion of the portion on which the SAW filter 12 is fixed. Each of the electrodes of the package is electrically connected to the SAW filter 12 via bonding wires. The electrodes of the package include the package reference potential electrodes TPCg1, TPCg2, TPCg3, and TPCg4, and also include the package input electrode TPCi and the package output electrode TPCo.

Figure 4:
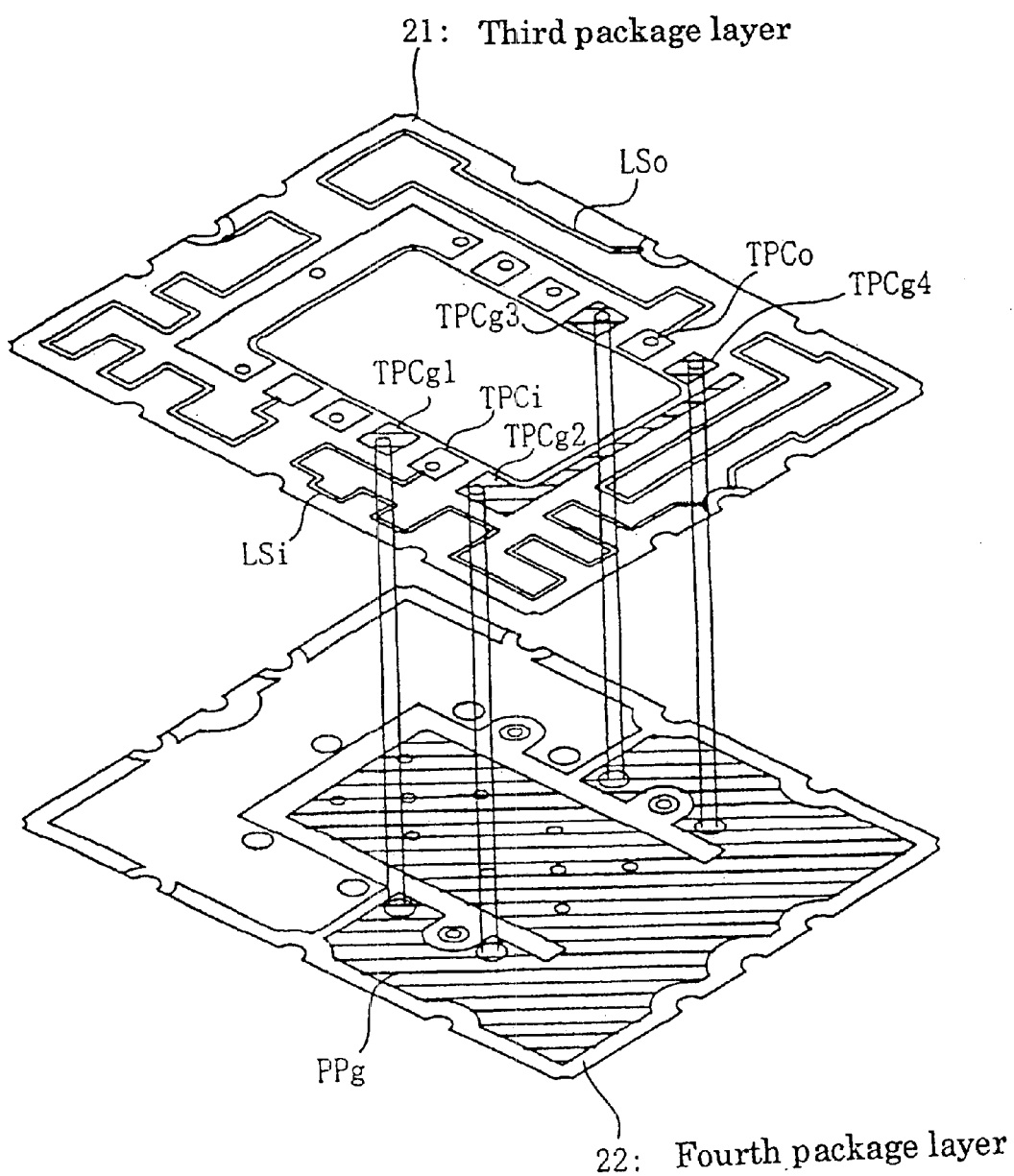
FIG. 4 shows a schematic diagram of the ceramic package of the first preferred embodiment of the present invention.

The package reference potential electrodes TPCg1, TPCg2, TPCg3, and TPCg4 are electrically connected to a fourth package layer 22 via through holes as shown in FIG. 4. A reference potential interconnect pattern PPg is formed on the fourth package layer 22 and electrically connected to the package reference potential electrodes TPCg1, TPCg2, TPCg3, and TPCg4 in this preferred embodiment. A package input electrode TPCi is electrically connected to an input signal line LSi, and a package output electrode TPCo is electrically connected to an output signal line LSo. The SAW filter device 11 sends and receives signals via the input/output signal lines. The input line LSi and the output line LSo are formed on the third package layer 21 in this embodiment.

Figure 5:
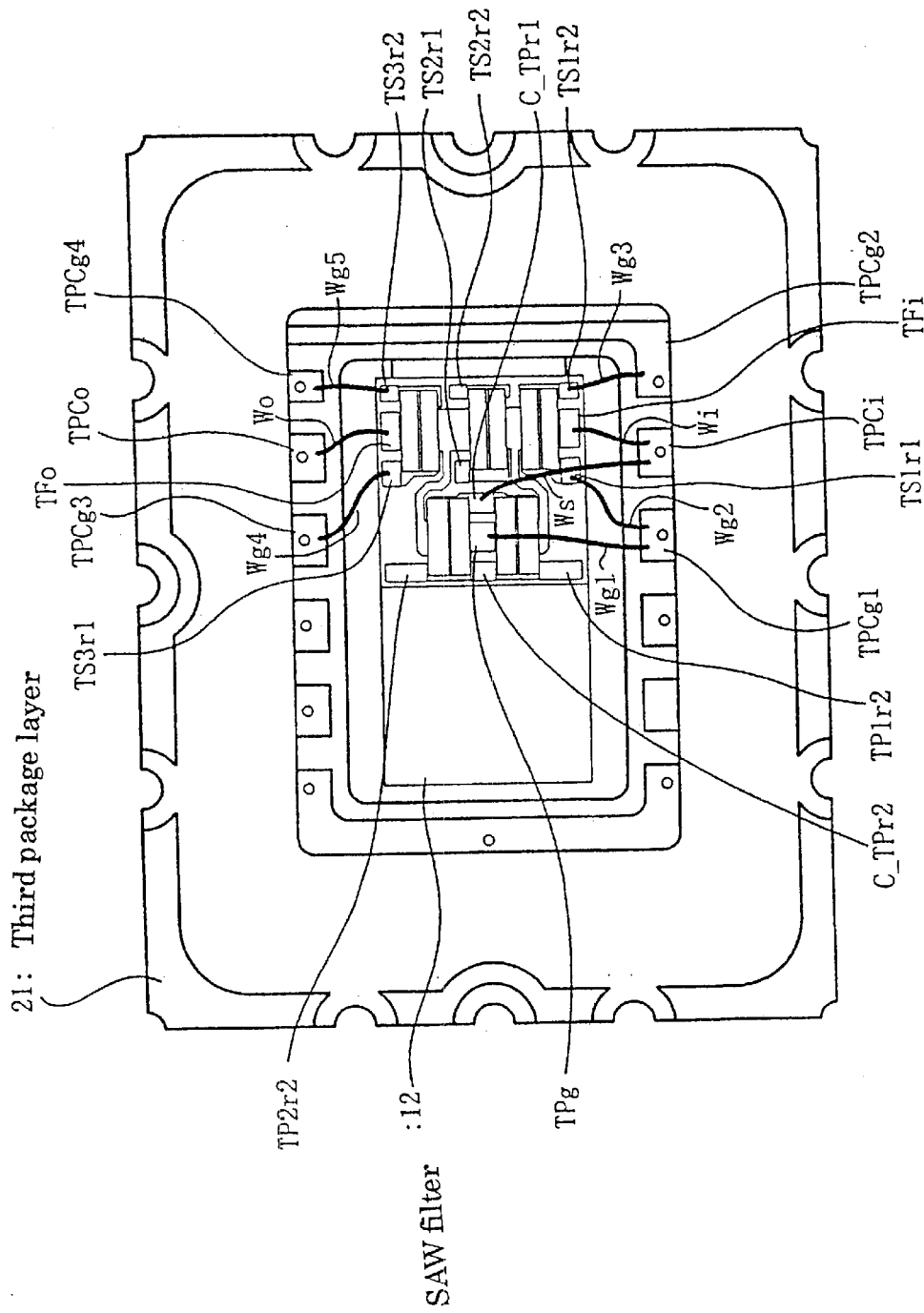
FIG. 5 shows electric connections between the SAW filter and the ceramic package of the first preferred embodiment of the present invention.

The SAW filter 12 is fixed on the third package layer 21 as described above. FIG. 5 shows electrical connection between the SAW filter 12 and the third package layer 21 of this embodiment.

The reflector electrodes TS1r1 and TS1 r2 of the first series resonator are connected to the package reference potential electrodes TPCg1 and TPCg2 respectively via bonding wires Wg2 and Wg3. The reflector electrodes TS2r1 and TS2r2 of the second series resonator are not connected to the electrodes of the third package layer 21. The reflector electrodes TS3r1 and TS3r2 of the first series resonator are connected to the package reference potential electrodes TPCg3 and TPCg4 respectively via wires Wg4 and Wg5. Therefore, the reflectors of the first and third series resonator S1, S3 are in a reference potential state. The reflectors of the second series resonator S2 are in a floating state.

The filter input terminal TFi is connected to the package input electrode TPCi via the bonding wire Wi, and the filter output terminal TFo is connected to the package output electrode TPCo via the bonding wire Wo. The parallel arm reference terminal TPg is connected to the package reference potential electrode TPCg1 via the bonding wire Wg1.

The first common electrode CTPr1 and the second common electrode CTPr2 are not connected to the package reference potential electrodes TPCg1, TPCg2, TPCg3 and TPCg4. Therefore, the common electrodes CTPr1 and CTPr2 are in a floating state. The reflectors of the parallel arm are in a floating state because they are connected to the first common electrode CTPr1 and the second common electrode CTPr2.

The first common electrode CTPr1, which is in a floating state, is connected to the package input electrode TPCi via the stub bonding wire Ws as shown in FIG. 1 and FIG. 5. The stub bonding wire Ws is formed to make a stub. The stub bonding wire Ws and the first common electrode CTPr1 work as an open stub in this embodiment. The stub bonding wire Ws works as the open stub even if it is connected between the first common electrode CTPr1 and the filter input terminal TFi. This means that the open stub (the stub bonding wire) can be connected between an input signal line (for example, TPCi, TFi) and a floating electrode.

The open stub is particularly described below. The open stub is a transmission line which has an open end. That means the open stub has an end in a floating state. The stub bonding wire Ws corresponds to the open stub in this embodiment. An input impedance Zin of the open stub is expressed by the following equation:

$$Zin = jZo \cot(\beta L) \quad (1)$$

where Zo is a characteristic impedance of the transmission line, L is a length of the transmission line (the open stub), and $\beta$ is a phase constant. The phase constant expresses a varied phase angle while a wave move one meter in a transmission line. The phase constant is calculated by $2\pi d/\lambda$ ($\lambda$:wavelength), and the unit of the phase constant is rad/m. Therefore, $\beta \times L$ expresses a varied phase angle in the open stub.

The input impedance of the open stub depends on the length L of the transmission line. In the case that the length L is smaller than $\lambda/4$ ($L<\lambda/4$), the open stub works as a capacitor. On the other hand, in the case that the length L is larger than $\lambda/4$, and is smaller than $\lambda/2$ ($\lambda/4<L<\lambda/2$), the open stub works as an inductance.

Figure 6:
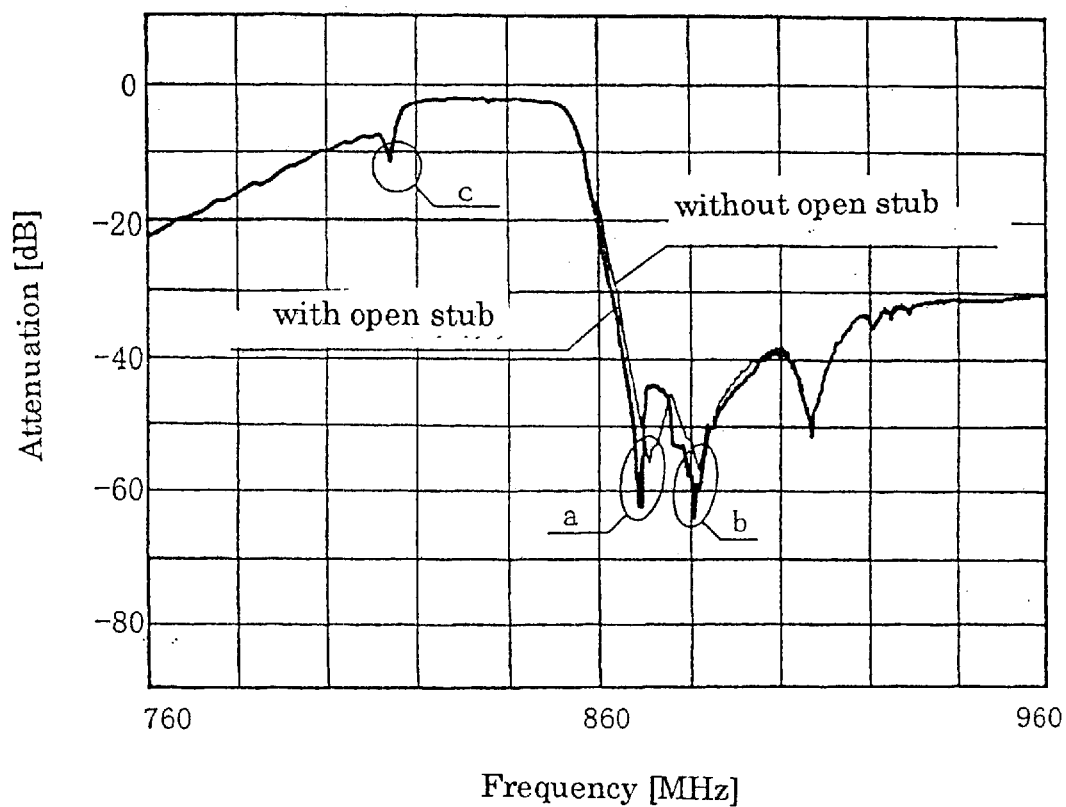
FIG. 6 shows a frequency characteristic of the SAW filter device of the first preferred embodiment of the present invention.

FIG. 6 shows a frequency characteristic of the SAW filter device 11 with the open stub. The frequency characteristic of this embodiment is shown as a heavy-line. The frequency characteristic of the conventional SAW filter device 1 is also shown in thin line in FIG. 6. FIG. 6 shows a result of an experiment by the inventor. However, this invention is not limited to the case described in FIG. 6 (for example, frequency). The SAW filter devices 1 and 11 are formed as a transmitting filter in this example. A wave band corresponding to the transmitting signal (Passing wave band: 824~849 MHz) should pass the filter without attenuation, and a wave band corresponding to receiving signals (Attenuating wave band: 869~894 MHz) should be attenuated by the filter device 1 or 11. The SAW filter device 11 of this embodiment improves an attenuating capacity within the attenuating wave band comparing to the conventional SAW filter device 1.

Therefore, this embodiment is not limited to the case described with reference to FIG. 6. (for example, frequency). The SAW filter devices 1 and 11 are formed as a transmitting filter in this example.

The first peak A of the attenuating wave band in FIG. 6 depends on the first series resonator S1 and the third series resonator S3. The second peak B of the attenuating wave band in FIG. 6 depends on the second series resonator S2. The third peak C in FIG. 6 depends on the first parallel resonator P1 and the second parallel resonator P2.

Figure 7:
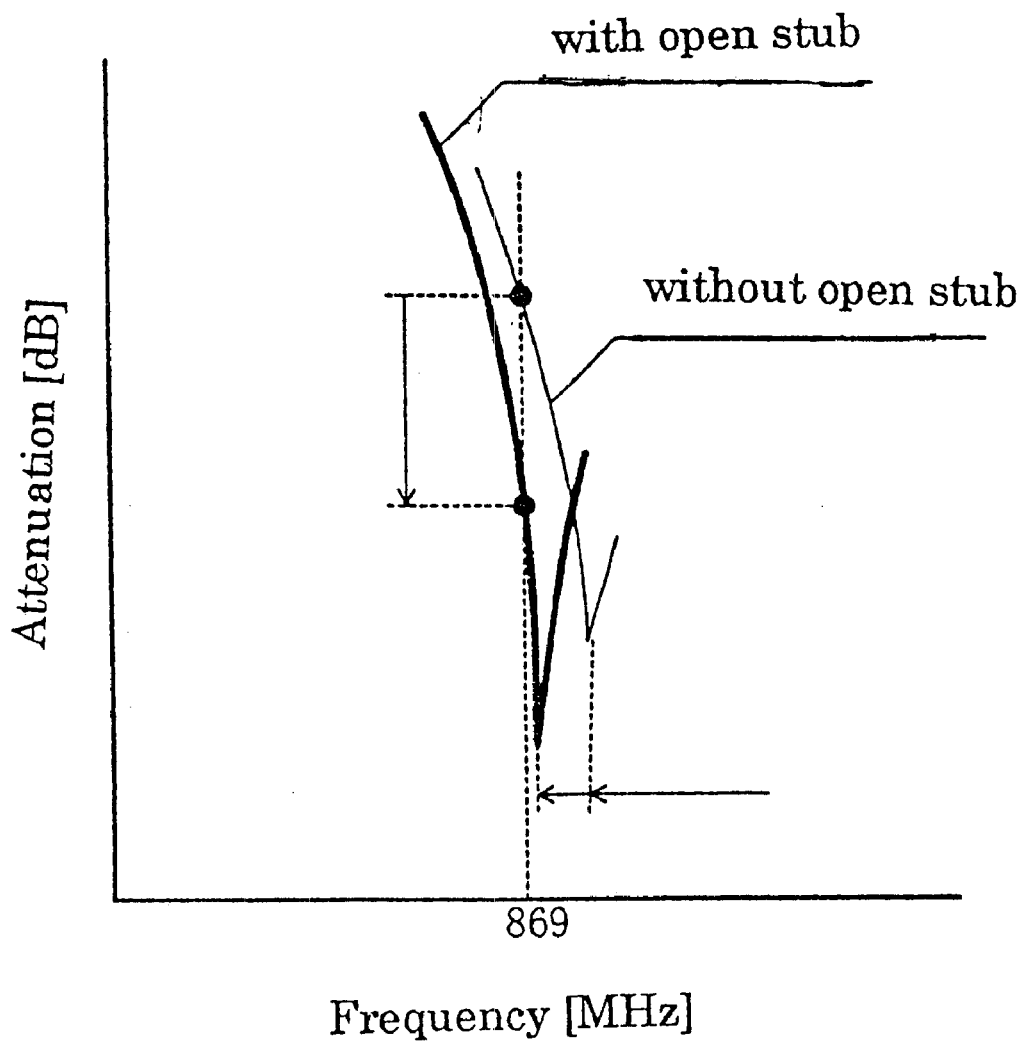
FIG. 7 shows the enlarged frequency characteristic of the SAW filter device of the first preferred embodiment of the present invention.

The frequency characteristic of the SAW filter device 11 with the open stub is shifted to a lower frequency position than that of the conventional SAW filter device 1 FIG. 7 is an enlarged diagram of FIG. 6. FIG. 7 shows the characteristic around 869 MHz, which is the lower limit of the attenuating wave band. The first peak A of the SAW filter device 11 is shifted to a lower frequency position than that of the conventional SAW filter device 1. Therefore, the attenuating capacity of the SAW filter device 11 is improved than that of the conventional SAW filter device 1.

Figure 8:
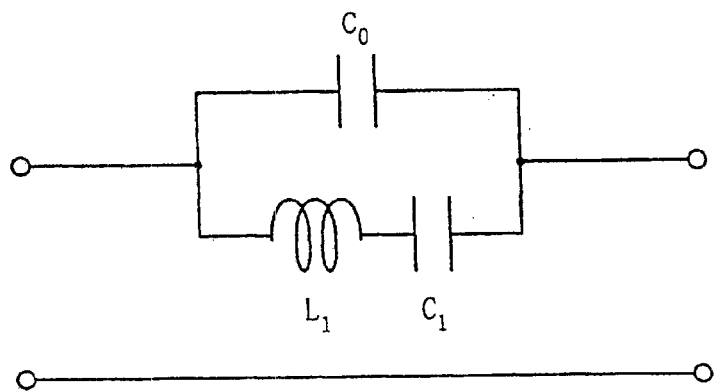
FIG. 8(a) shows an equivalent circuit diagram of a conventional SAW filter device.
FIG. 8(b) shows an equivalent circuit diagram of the SAW filter device of the first embodiment of the present invention.
Figure 8:
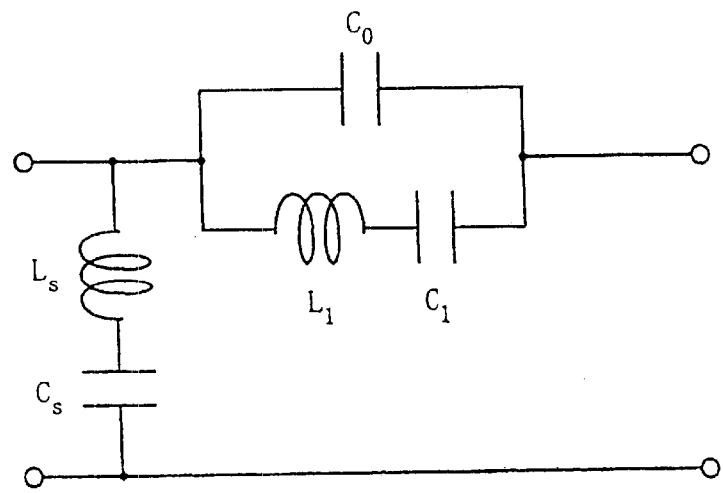

FIG. 8(a) shows an equivalent circuit of the conventional SAW filter device 1 which does not have the open stub. The conventional SAW filter device 1 does not have the stub bonding wire Ws. FIG. 8(b) shows an equivalent circuit of the SAW filter device 11 of the preferred embodiment. The SAW filter device 11 of this embodiment has the open stub. The stub bonding wire Ws is connected to the package input electrode TPCi of the SAW filter device 11.

The attenuating characteristic $\alpha 1$ of the conventional SAW filter device 1 is expressed by following equation:

$$\alpha 1 = 10 LOG(1 + K_1^2/4) \quad (3)$$

where $$K_1 = (1 - \omega^2 L_1 C_1)/(C_0 + C_1 - \omega^2 L_1 C_1 C_0) \quad (4)$$

Therefore, the frequency, at which the first peak A appears, is calculated by following equation:

$$C_0 + C_1 - \omega^2 L_1 C_1 C_0 = 0 \quad (5)$$

On the other hand, the attenuating characteristic $\alpha 2$ of the SAW filter device 11 is expressed by following equation:

$$\alpha 1 = 10 LOG((1 + K_1 K_2/2)^2 + ((K_1 + K_2)/2)^2) \quad (6)$$

where $$K_2 = \omega^2 C_s/(11 - \omega^2 L_s C_s) \quad (7)$$

The frequency, at which the first peak A appears, is calculated by calculating a composite impedance of the circuit as shown in FIG. 8(a) and the circuit as shown in FIG. 8(b).

$$C_0 + C_1 - \omega^2 L_1 C_1 C_0 = 0 \quad (8)$$

$$11 - \omega^2 L_s C_s = 0 \quad (9)$$

The frequency, which is applied to the equation 8 and 9, is the peak frequency A of this embodiment. The frequency characteristic is improved because of the open stub in this embodiment.

Figure 9:
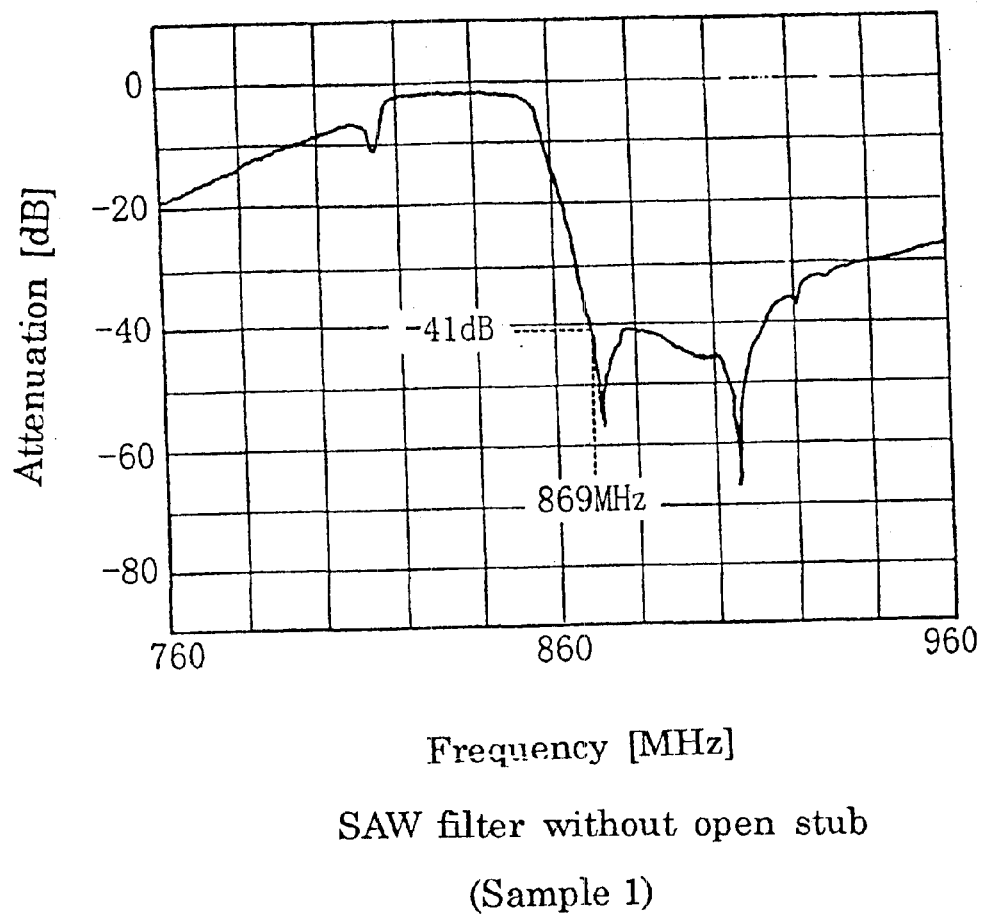
FIG. 9 shows a frequency characteristic of the conventional SAW filter device.
Figure 10:
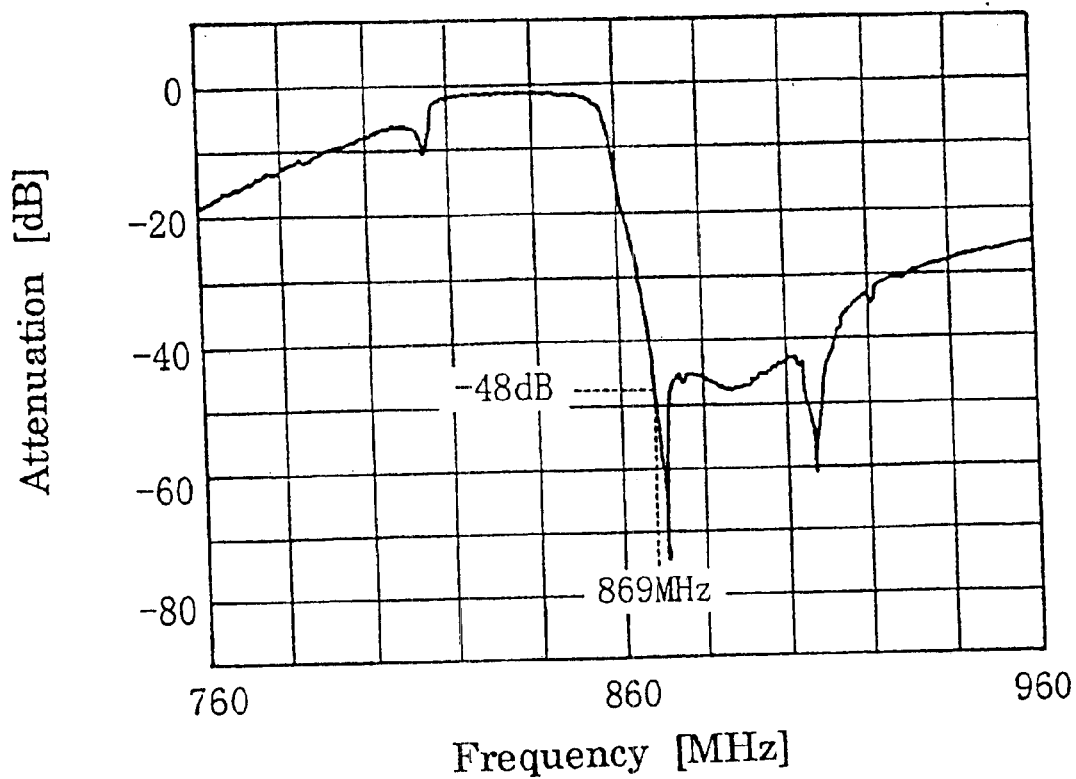
FIG. 10 shows a frequency characteristic of the SAW filter device of the first preferred embodiment of the present invention.

According to an experiment of the inventor, an attenuation of a sample 1 without the wire Ws, which corresponds to the conventional SAW filter device 1, is −41 dB at 869 MHz, and FIG. 9 shows a detailed frequency characteristic of that sample 1. An attenuation of a sample 2 with the stub bonding wire Ws between CTPr1 and TPCi, which corresponds to the SAW filter device 11 of this embodiment, is −48 dB at 869 MHz. FIG. 10 shows a detailed frequency characteristic of that sample 2. The attenuation is increased 7 dB in the experiment because of the stub bonding wire Ws. Therefore, the stub bonding wire Ws improves the characteristics of the SAW filter device.

Figure 11:
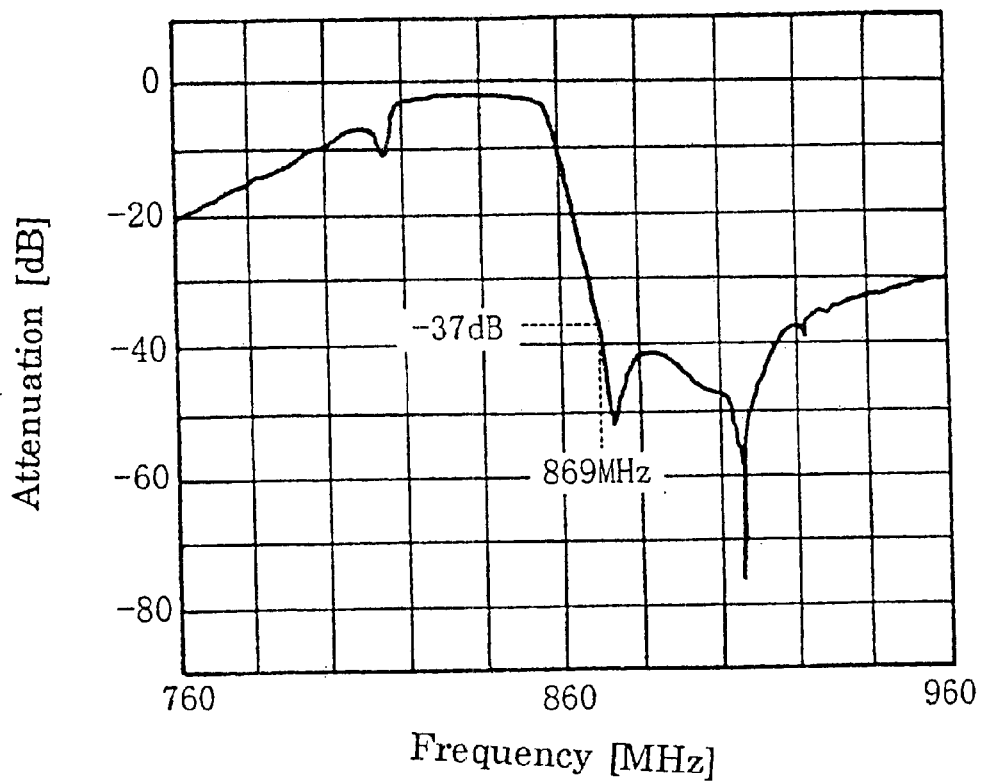
FIG. 11 shows a frequency characteristic of the conventional SAW filter device.
Figure 12:
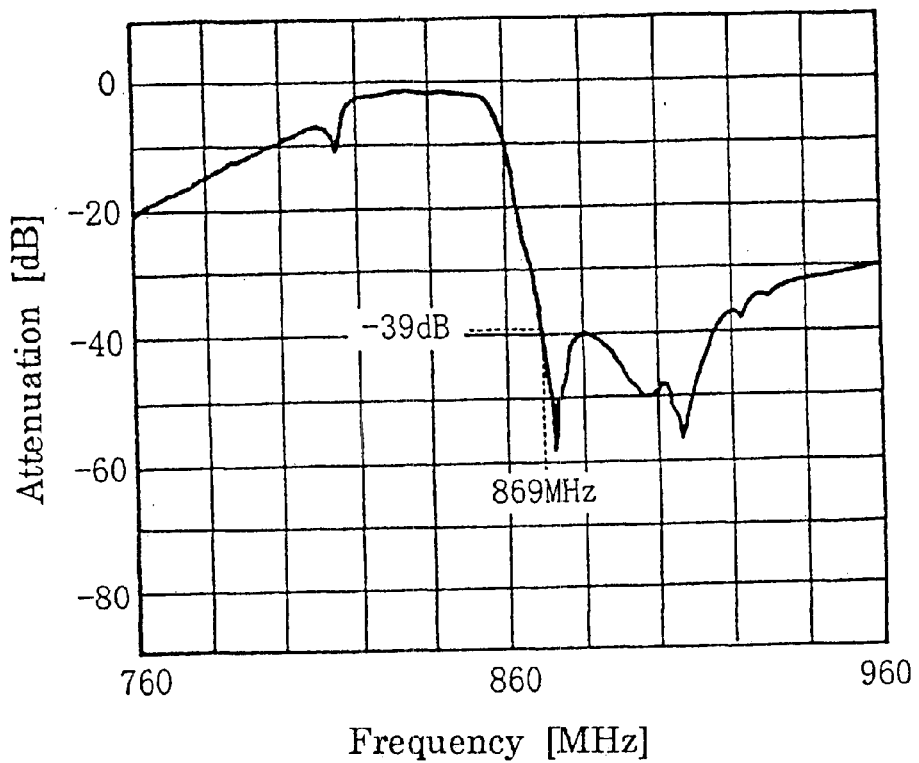
FIG. 12 shows a frequency characteristic of the SAW filter device of the first preferred embodiment of the present invention.

As described above, the input impedance of the open stub depends on the length L of the transmission line. It means the frequency characteristic also depends on the length of the open stub. In the preferred embodiment, the first common electrode CTPr1 is much shorter than the stub bonding wire Ws. Therefore, the length of stub bonding wire Ws can be considered as a substantial length L of the transmitting line. According to another experiment of the inventor, an attenuation of a sample 3 without the stub bonding wire Ws (the sample 3 is different from the sample 1), which corresponds to the conventional SAW filter device 1, is −37 dB at 869 MHz. FIG. 11 shows a detailed frequency characteristic of that sample 3. Then, the stub bonding wire Ws is formed on the sample 3 between the package input electrode TPCi and the first common electrode CTPr1. (sample 4) The stub bonding wire Ws has an length of L1 in sample 4. The sample 4 corresponds to the SAW filter device 11 of this embodiment. The attenuation of the sample 4 is −39 dB at 869 MHz. FIG. 12 shows a detailed frequency characteristic of that sample 4. The attenuation is increased 2 dB in this experiment because of the attachment of the stub bonding wire Ws.

Figure 13:
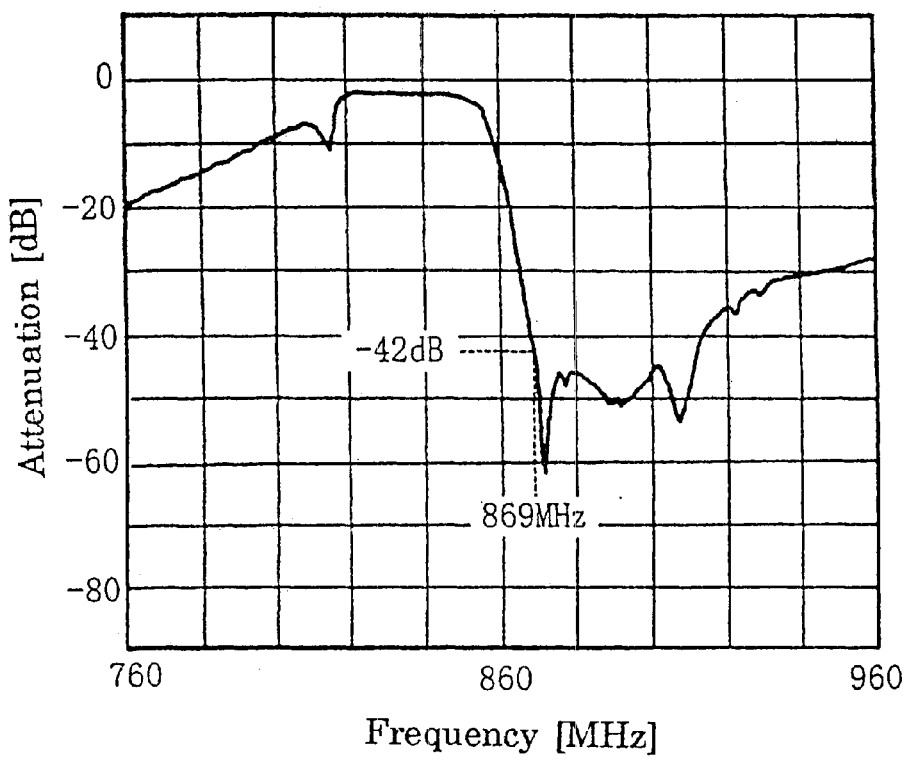
FIG. 13 shows a frequency characteristic of the SAW filter device of the first preferred embodiment of the present invention.

Then, the stub bonding wire Ws with the length of L2 is formed on the sample 3 between the package input electrode TPCi and the first common electrode CTPr1. (sample 5) The sample 5 corresponds to the SAW filter device 11 of this embodiment, and the length L2 is longer than the length L1. The attenuation of a sample 5 is −41 dB at 869 MHz. FIG. 13 shows a detailed frequency characteristic of the sample 5. The attenuation is further increased 2 dB in this experiment because the length L2 of the stub bonding wire Ws is longer than the length L1.

However, a too long stub bonding wire Ws makes the passing wave band narrow. Therefore, the length of the stub bonding wire Ws should be as long as possible unless the passing wave band is not changed.

As described precisely above, the attenuating wave band is shifted to lower because of the stub bonding wire Ws in this embodiment, and the attenuation near the boundary frequent become greater. Therefore, the signals of the attenuating wave band are decreased more properly. The open stub of this embodiment is made of the stub bonding wire Ws. Therefore, the open stub is formed more easily, and the length of the open stub is controlled easily. For example, it needs more complex steps to form the open stub with a patterned interconnect on a piezoelectric substrate. The size of the SAW filter device 11 shrinks because the open stub can be decided according to a height of the stub bonding wire Ws.

The bonding wire Ws is connected between the package input electrode TCPi and the first common electrode CTPr1, therefore there is no need to form a new electrode on the piezoelectric substrate, and a larger piezoelectric substrate is not needed.

The stub bonding wire Ws forms the open stub in this embodiment. When the frequency characteristic of the SAW filter device is changed, it is easy to change the length of the open stub without changing a circuit pattern on the substrate.

The stub bonding wire Ws is connected to the first common electrode CTPr1 in this embodiment. However, the stub bonding wire Ws can be connected between a floating electrode and the input terminal Tfi or the package input terminal TCPi. For example, the stub bonding wire Ws can be connected between the second common electrode CTPr2 and package input electrode TPCi, or the second common electrode CTPr2 and the filter input terminal TFi, etc. It means the open stub (the stub bonding wire) can be connected between a predetermined point of an input signal line (For example, TPCi, TFi) and a floating electrode.

Figure 14:
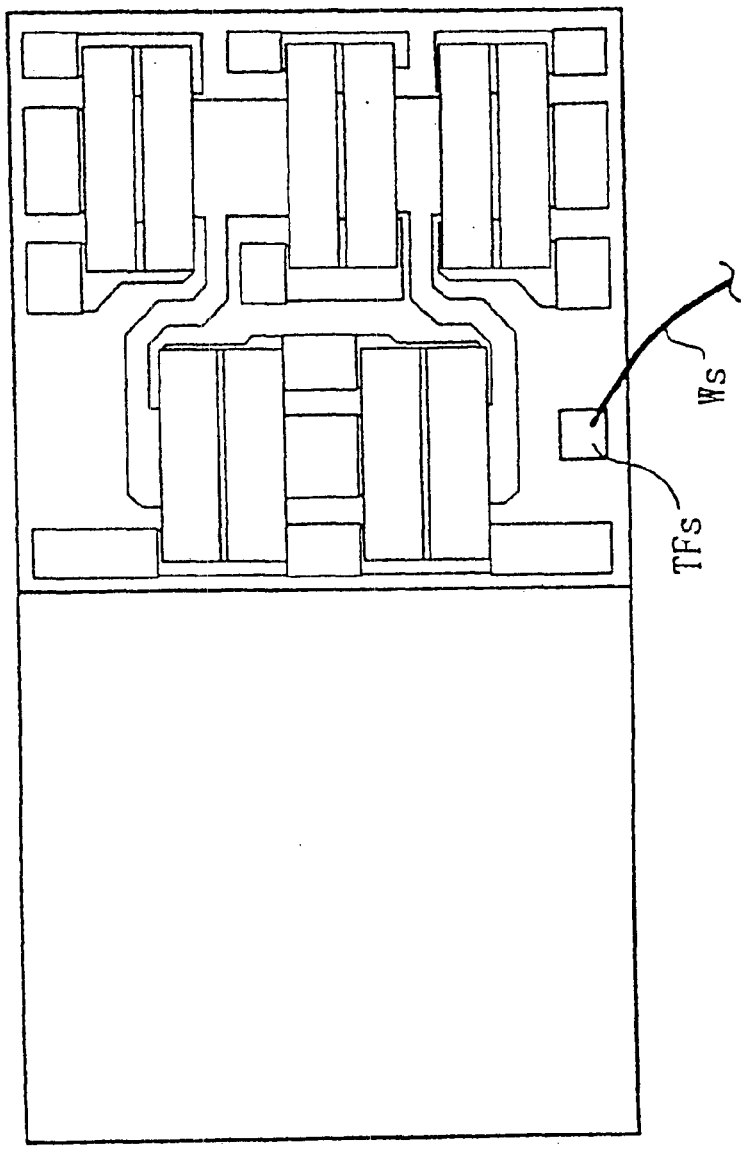
FIG. 14 shows a plane view of a SAW filter of the second preferred embodiment of the present invention.

FIG. 14 shows a schematic diagram of a SAW filter 32 of a second embodiment of the present invention.

A stub electrode TFs is formed on the piezoelectric substrate in this embodiment, and is in a floating state. Other elements are the same as the first embodiment.

In case it is difficult to connect a bonding wire Ws to the reflector electrodes without influence from resonators and other wires, the stub electrode TFs is formed on the piezoelectric substrate. The stub electrode is arranged to avoid the influences from other part of the SAW filter device. It is possible to change the size of the stub electrode TFs, therefore the length of the open stub is controlled more precisely.

Figure 15:
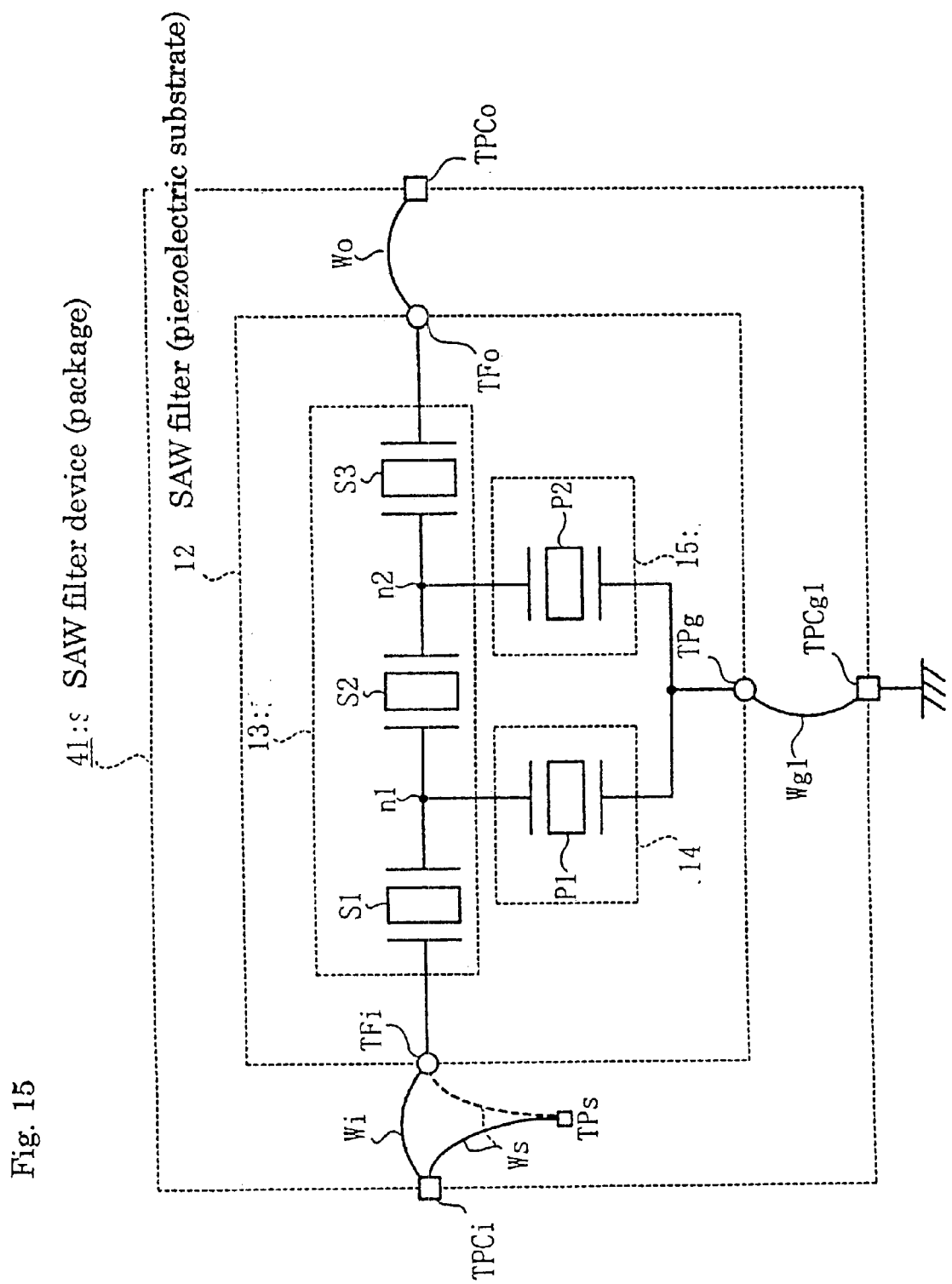
FIG. 15 shows a schematic diagram of a SAW filter device of a second preferred embodiment of the present invention.

FIG. 15 shows schematic diagram of a third embodiment of the present invention.

The wire Ws is connected to the electrodes on the SAW filter 12 in other embodiments. However, the wire can be connected between a floating electrode and the package input electrode TPCi. FIG. 15 shows the SAW filter device 41, which has the stub electrode TPs on its package. The stub electrode is in a floating state.

The wire Ws is formed between the package input electrode TPCi and the stub electrode TPs, or the filter input terminal TFi and the stub electrode TPs in this embodiment. The input impedance of the SAW filter device is controlled properly because of the stub bonding wire Ws.

Figure 16:
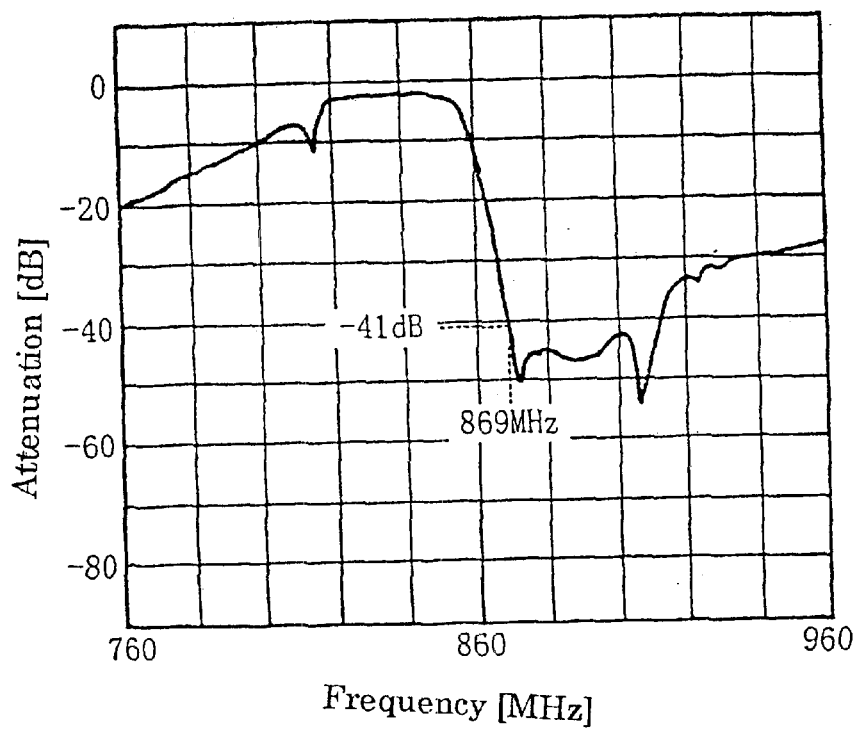
FIG. 16 shows a frequency characteristic of the SAW filter device of the first preferred embodiment of the present invention.

The stub bonding wire Ws is connected between the input electrode and the floating electrodes in the embodiments. However, the same effect is achieved by connecting the stub bonding wire Ws between the output electrode and the floating electrodes. (For example, TFo and CTPr1, TPCo and CTPr2) It means the open stub (stub bonding wire Ws) can be connected between a point of the output signal line and a floating electrode. FIG. 16 is a frequency characteristic of a sample 6. The sample 6 is made by connecting the output electrode and the first common electrode CTPr1 of the above described sample 3. The attenuation of the sample 6 is −41 dB at 869 MHz. The attenuation is increased 4 dB in this experiment because of the attachment of the stub bonding Ws between the output terminal and the first common electrode.

The one side of the open stub made with the stub bonding wire Ws can be connected to the input electrode or the output electrode, and another side of the open stub is connected to a floating electrode. The open stub can be formed at the input terminal and the output terminal respectively.

Figure 17:
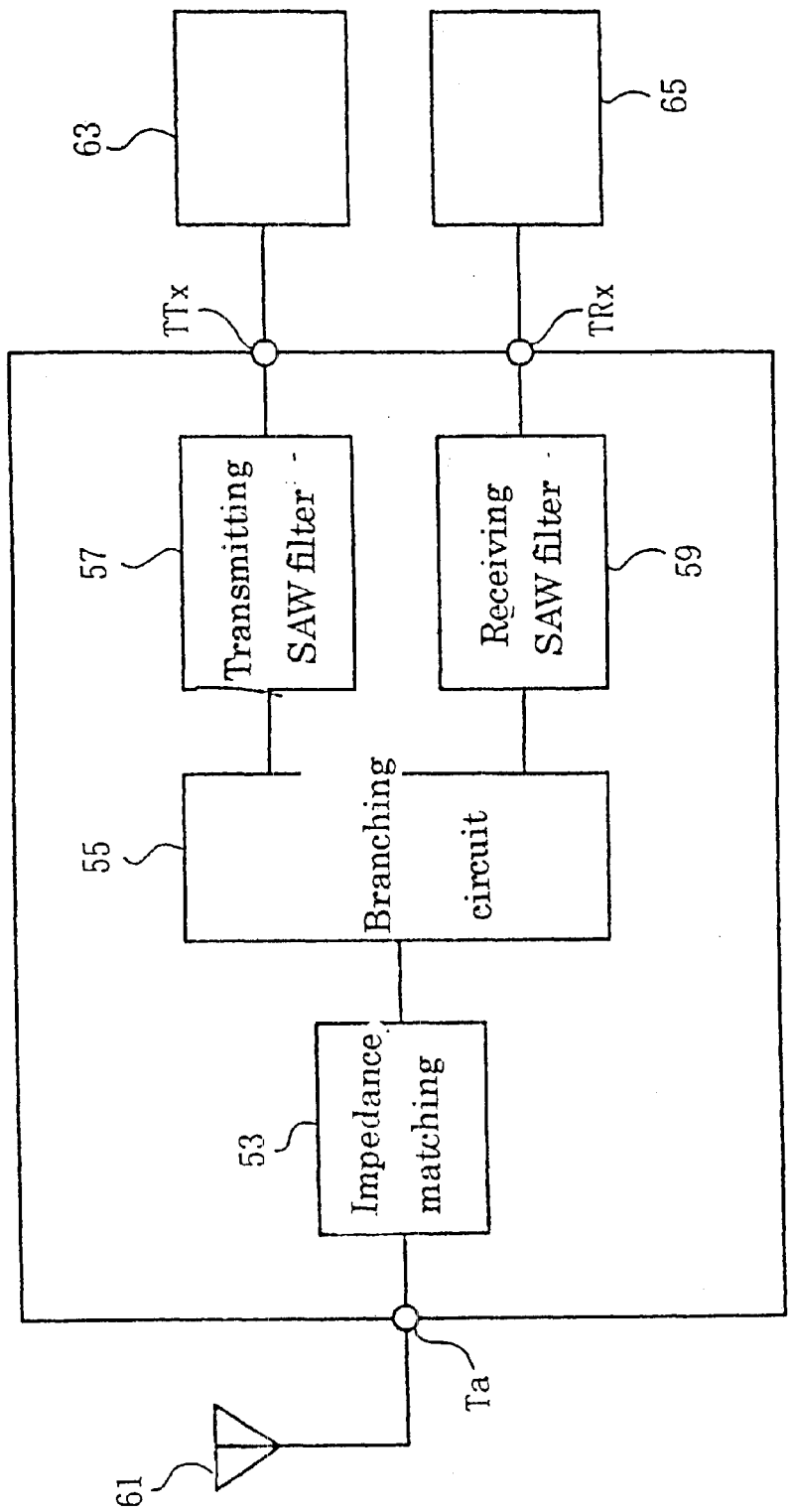
FIG. 17 shows a SAW branching filter. The SAW branching filter includes the SAW filter devices of the embodiments.
Figure 18:
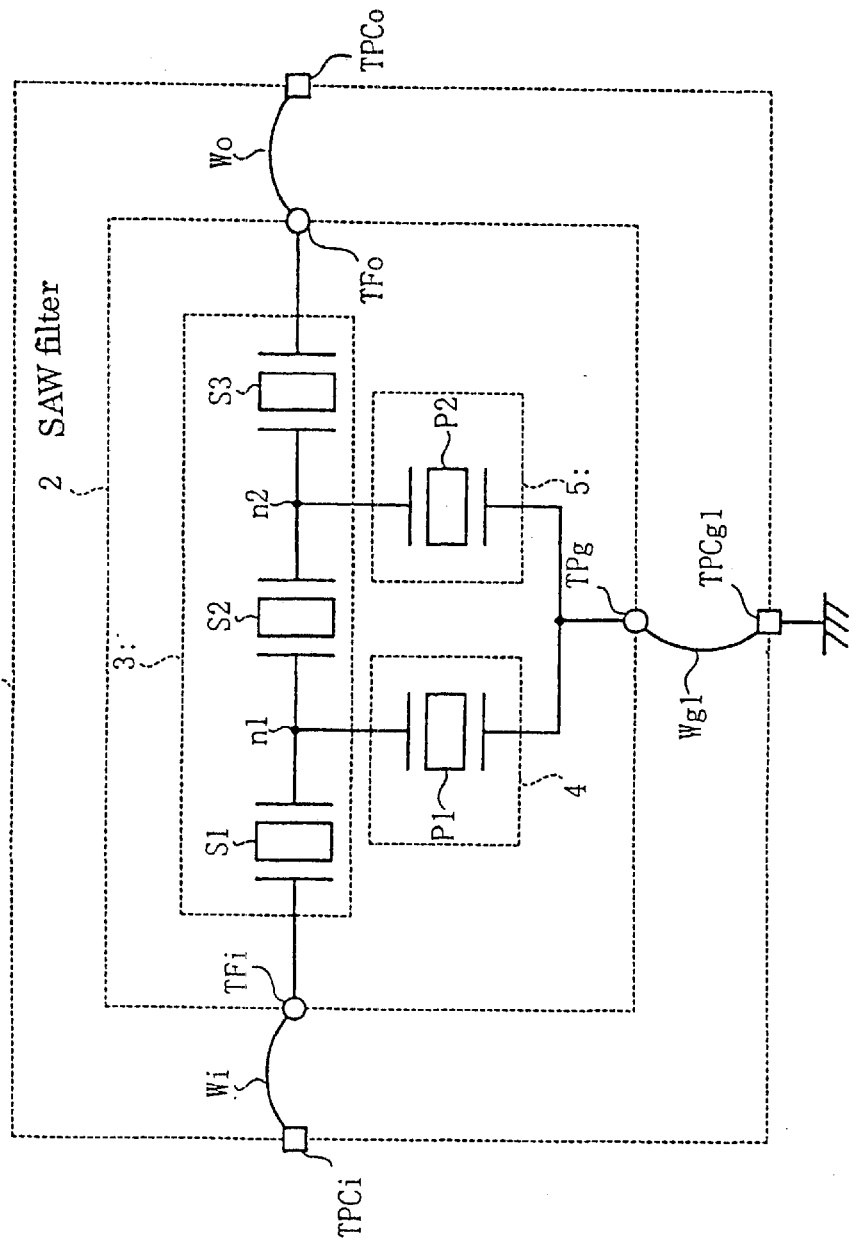
FIG. 18 shows a schematic diagram of the conventional SAW filter device.

FIG. 17 shows a SAW branching filter 51. The SAW branching filter includes the SAW filter devices of the embodiments. The SAW branching filter 51 has an impedance matching circuit 53, a branching filter 55, a transmitting SAW filter device 57 and a receiving SAW filter device 59. If the wave band of she receiving signals is higher than that of the transmitting signals, the SAW filter device 11 (41) of the embodiment is applied as the transmitting SAW filter device 57. (for example, the transmitting wave band 824–849 MHz, the receiving wave band 869–894 MHz) If the wave band of she receiving signals is lower than that of the transmitting signals, the SAW filter device 11 (41) of the embodiment is applied as the receiving SAW filter device 59.

The impedance matching circuit 53 is connected to an external antenna device 61 via an antenna terminal Ta, and the impedance matching circuit 53 is connected to a transmitting SAW filter device 57 and a receiving SAW filter device 59 via the branching circuit 55.

The transmitting SAW filter device is connected to an external transmitting circuit 63 via a transmitting terminal TTx The receiving SAW filter device is connected to an external receiving circuit 65 via a receiving terminal TRx.

If the SAW filter device 11 (41) of the embodiment is applied as the transmitting SAW filter device 57, an impedance matching between the transmitting circuit and the transmitting SAW filter device 57 is improved in addition to the improvement in the SAW filter device. If the SAW filter device 11 or 41 of the embodiment is applied as the receiving SAW filter device 59, an impedance matching between the receiving circuit and the transmitting SAW filter device 59 is improved in addition to the improvement in the SAW filter device.

What is claimed is:

1. A surface acoustic wave device comprising:

a piezoelectric substrate;

a first plurality of resonators formed on said piezoelectric substrate, said first plurality of resonators being connected in series;

a second plurality of resonators formed on said piezoelectric substrate, said second plurality of resonators being connected in parallel;

an input signal line receiving input signals;

a floating electrode being in a floating state; and a wire connecting a point of said input signal line to said floating electrode.

2. The surface acoustic wave device according to claim 1, further comprising:

a package fixing said piezoelectric substrate, and including a package input electrode;

wherein the point of said input signal line is the package input electrode.

3. The surface acoustic wave device according to claim 2, wherein said floating electrode is an electrode formed on said piezoelectric substrate.

4. The surface acoustic wave device according to claim 2, wherein said floating electrode is an electrode formed on said package.

5. The surface acoustic wave device according to claim 1, wherein said piezoelectric substrate includes a filter input terminal, and the point of said input signal line is the filter input terminal.

6. The surface acoustic wave device according to claim 1, wherein said floating electrode is an electrode formed on said piezoelectric substrate.

7. The surface acoustic wave device according to claim 1, further comprising:

a package fixing said piezoelectric substrate, wherein said piezoelectric substrate includes a filter input terminal, and the point of said input signal line is the filter input terminal, and wherein said floating electrode is an electrode formed on said package.

8. A surface acoustic wave device comprising:

a piezoelectric substrate;

a first plurality of resonators formed on said piezoelectric substrate, said first plurality of resonators being connected in series;

a second plurality of resonators formed on said piezoelectric substrate, said second plurality of resonators being connected in parallel;

an output signal line transmitting output signals;

a floating electrode being in a floating state; and a wire connecting a point of said output signal line to said floating electrode.

9. The surface acoustic wave device according to claim 8, further comprising:

a package fixing said piezoelectric substrate, and including a package output electrode;

wherein the point of said output signal line is the package output electrode.

10. The surface acoustic wave device according to claim 9, wherein said floating electrode is an electrode formed on said piezoelectric substrate.

11. The surface acoustic wave device according to claim 9, wherein said floating electrode is an electrode formed on said package.

12. The surface acoustic wave device according to claim 8, wherein said piezoelectric substrate includes a filter output terminal, and the point of said output signal line is the filter output terminal.

13. The surface acoustic wave device according to claim 8, wherein said floating electrode is an electrode formed on said piezoelectric substrate.

14. The surface acoustic wave device according to claim 8, further comprising:

a package fixing said piezoelectric substrate, wherein said piezoelectric substrate includes a filter output terminal, and the point of said output signal line is the filter output terminal, and wherein said floating electrode is an electrode formed on said package.

* * * * *

UNITED STATES PATENT AND TRADEMARK OFFICE
CERTIFICATE OF CORRECTION

| | |
|---|---|
| PATENT NO. | : 6,480,077 B2 |
| APPLICATION NO. | : 09/805898 |
| DATED | : November 12, 2002 |
| INVENTOR(S) | : Wataru Ohashi |

It is certified that error appears in the above-identified patent and that said Letters Patent is hereby corrected as shown below:

IN THE REFERENCES CITED ITEM (56):

In the listing of U.S. Patent Documents, add U.S. Patent No. 5,053,734

In the listing of Foreign Patent Documents, add Japanese Patent No. 2-298101

Signed and Sealed this
Nineteenth Day of June, 2012

David J. Kappos
*Director of the United States Patent and Trademark Office*